APPARATUS FOR PRODUCING A MULTILAYER PRINTED CIRCUIT PLATE ASSEMBLY

Filed Aug. 7, 1969

INVENTORS

TOKU HOJU, TOSHIO SASAKI, HIROSHI MOTOJIMA and HIDEAKI SASAKI

BY Craig, Antonelli, Stewart & Hill

ATTORNEYS

United States Patent Office 3,681,171
Patented Aug. 1, 1972

3,681,171
APPARATUS FOR PRODUCING A MULTILAYER PRINTED CIRCUIT PLATE ASSEMBLY

Toku Hojo, Yokohama, Toshio Sasaki, Kamakura-shi, Hiroshi Motojima, Yokohama, and Hideaki Sasaki, Hatano-shi, Japan, assignors to Hitachi, Ltd., Tokyo, Japan Filed Aug. 7, 1969, Ser. No. 848,191
Claims priority, application Japan, Aug. 23, 1968, 43/59,894
Int. Cl. B32b *31/00*
U.S. Cl. 156—382 1 Claim

ABSTRACT OF THE DISCLOSURE

A method and apparatus for producing a multilayer printed circuit plate assembly consisting of a laminate of a plurality of printed circuit plates, each having circuits formed on one or both surfaces thereof by etching, and at least one adhesive layer interposed between adjacent ones of said printed circuit plates, in which an air-tight sealed chamber is formed enclosing said laminate by means of a vacuum packing jig means and said laminate is compressed and heated in said sealed chamber while exhausting air from said sealed chamber by a vacuum pump, whereby the formation of air bubbles in each adhesive layer in the process of compression and heating is prevented.

The present invention relates to a method of producing a multilayer printed circuit plate assembly by compressing and heating a plurality of plates each having a circuit or circuits printed thereon i.e. a plurality of printed circuit plates, without permitting air bubbles to be formed in any adhesive layer interposed between adjacent plates, and also relates to an apparatus for practicing the above-described method.

A multilayer printed circuit plate assembly is used for obtaining a complicated electrical circuit connection in a data processing apparatus in particular. The multilayer printed circuit plate assembly is designed to be used in place of complicated wiring on the back panel of a data processing apparatus or the like, which has heretofore been effected by manual operation, and enables stabilization of and reduction in cost of the wiring to be realized and guarantees high speed operation of the apparatus.

In the past, the multilayer printed circuit plate assembly has been produced by compressing together and heating a large number of plates, each having a circuit or circuits formed on one or both surfaces thereof by etching, with at least one adhesive layer interposed between adjacent plates. However, such a method had many disadvantages, because in the practice of the method air bubbles are formed in the adhesive layer as a result of air being trapped in said layer, so that bulges occur on the multilayer printed circuit plate assembly at locations corresponding to the locations of the air bubbles or a plating layer of uniform thickness cannot be formed on the peripheral wall of a through hole penetrating through said assembly due to recesses formed in said wall or the copper foil pattern interior of the plate assembly is destroyed, in the process of the chemical treatment of the assembly, by the treating liquid penetrating into the air bubbles.

It is, therefore, an object of the present invention to provide a method of producing a multilayer printed circuit plate assembly, which does not permit air bubbles to be formed in at least one adhesive layer interposed between adjacent individual printed circuit plates.

It is another object of the present invention to provide an apparatus for practicing the method described above.

Namely, according to the present invention there are provided a method and apparatus for producing a multilayer printed circuit plate assembly by placing a laminate consisting of a number of printed circuit plates, each having a circuit or circuits printed on one or both surface thereof by etching, and at least one adhesive layer each interposed between adjacent ones of said printed circuit plates, on a lower heating plate, after clamping said laminate between jigs if necessary, and compressing and heating said laminate between an upper heating plate and the lower heating plate, in which an air-tight sealing chamber is formed in a space produced by the thicknesses of said laminate and said jigs by using a vacuum packing jig from which air is evacuated by a vacuum pump, whereby the formation of air bubbles in each of said adhesive layer is prevented.

More specifically, according to the present invention there is provided a method of producing a multilayer printed circuit plate assembly, which comprises forming a laminate consisting of a plurality of printed circuit plates and at least one layer of a semi-cured thermosetting adhesive interposed between adjacent ones of said printed circuit plates, compressing and simultaneously heating said laminate to effect bonding of said printed circuit plates with each other and exhausting air from the interspace between the adjacent printed circuit plates continuously from a time immediately before or substantially the same as the commencement of compression of said laminate at least to a time when said at least one adhesive layer is molten and cured.

Still according to the present invention there is provided an apparatus for producing a multilayer printed circuit plate assembly, which comprises an upper heating plate, a lower heating plate, a vacuum packing jig means mounted on either one of said upper and lower heating plates, one of said upper and lower heating plates being movable upward and downward so as to form a sealed chamber by said heating plates and said vacuum packing jig means when said two heating plates get close to each other in which chamber a laminate consisting of a plurality of printed circuit plates and at least one adhesive layer interposed between adjacent ones of said printed circuit plates is to be disposed and compressed and simultaneously heated, a vacuum pump for exhausting air from said sealed chamber, means for communicating said sealed chamber with said vacuum pump, and means for actuating said vacuum pump so that the air may be exhausted from said sealed chamber continuously for a period from a time immediately before or substantially the same as the commencement of compression of said laminated at least to a time when said at least one adhesive layer is molten and cured.

Figures 1, 2, 3, 4:
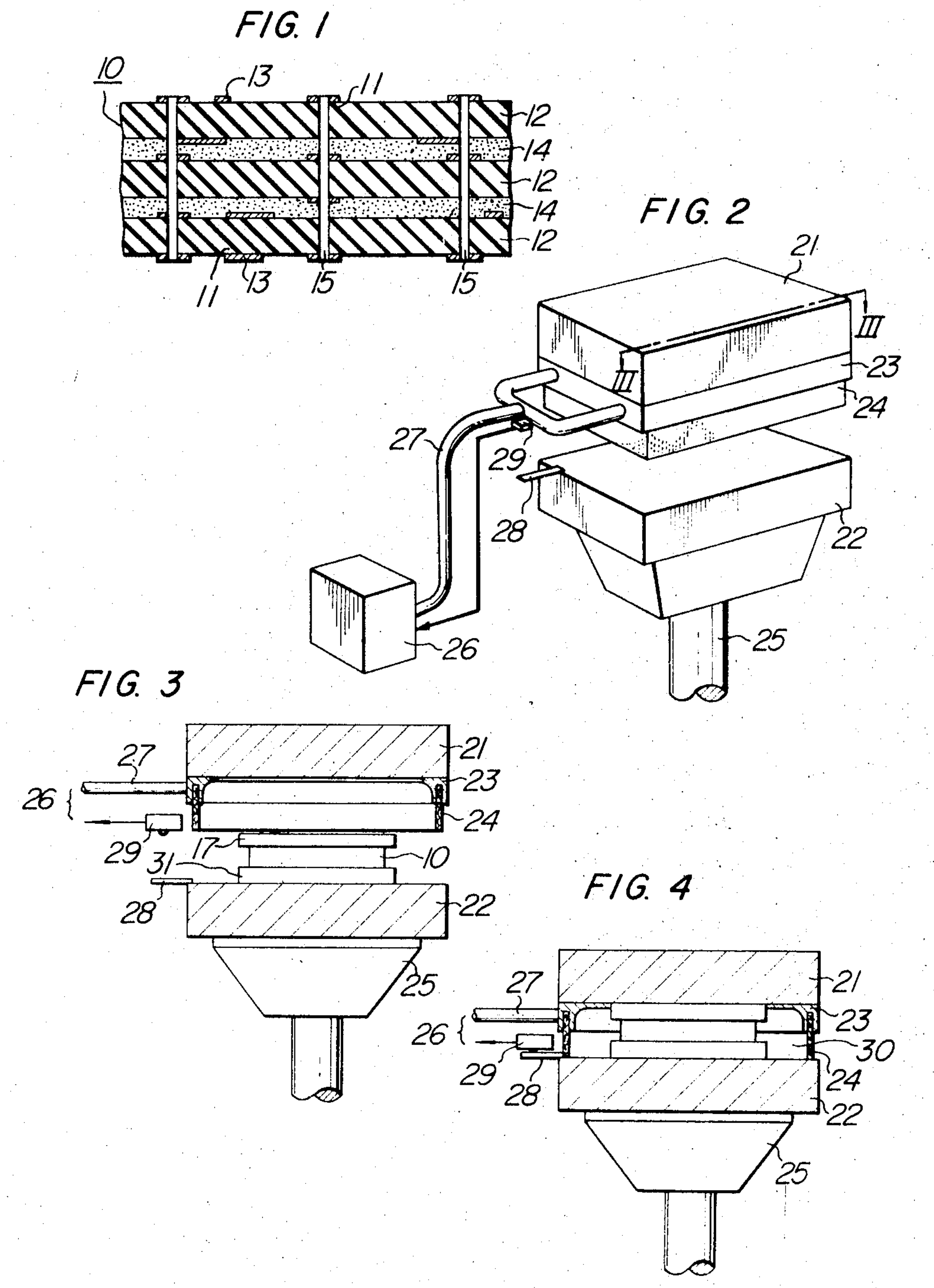
FIG. 1 is a sectional front view showing the structure of a multilayer printed circuit plate assembly.
FIG. 2 is a perspective view of a preferred embodiment of the apparatus for producing a multilayer printed circuit plate assembly according to the present invention.
FIG. 3 is a sectional view taken along the line III—III of FIG. 2.
FIG. 4 is a sectional view, similar to FIG. 3, showing the step in which a plurality of printed circuit plates are adhesively bonded together by compression and heating.

Referring to FIG. 1 there is shown a multilayer printed circuit plate assembly 10 consisting of three substrates 12 and six layers of circuit wiring 13. Each substrate 12 is made, for example, of a vitreous epoxy resin and has circuit wirings 13 formed on both surfaces thereof by etching, to constitute a sheet of printed circuit plate 11. The individual substrates 12 are bonded together by means of an adhesive layer 14 interposed between adjacent ones thereof. Through-holes 15 are formed penetrating through the printed circuit plate assembly 10 after a plurality of the printed circuit plates 11 are juxtaposed in superimposed relation and adhesively bonded together, and electrically connect the circuit wirings with each other by means of platings coated thereon.

In FIG. 2 there is shown the apparatus for producing a multilayer printed circuit plate assembly according to the present invention. An upper heating plate 21 and a lower heating plate 22 are respectively provided therein with a heater and a cooling tube for circulating cooling water therethrough. The lower heating plate 22 is mounted on a ram 25 and moved vertically thereby. The upper heating plate 21, on the other hand, is supported by a frame not shown and has a vacuum packing jig holder 23 and a vacuum packing jig 24 provided on the lower surface thereof. The holder 23 is provided for holding the vacuum packing jig 24 by which a sealed chamber is actually formed, and is mounted to the upper heating plate 21. It is to be understood that the holder 23 and the vacuum packing jig 24 may be mounted on the lower heating plate 22. The vacuum packing jig 24 is brought into engagement with the lower heating plate 22 and, therefore, must be made of a heat-resisting material such as silicon rubber. The interior of the holder 23 is communicated with a vacuum pump 26 through a conduit 27. The lower heating plate 22 is provided with a strip 28, whereas a microswitch 29 is provided above the lower heating plate 22, The arrangement being such that said strip 28 is brought into engagement with said microswitch 29 when the lower heating plate 22 is moved upwardly and gets close to the extremity of its ascending stroke. The microswitch 29 is electrically connected to a time switch provided on the vacuum pump 26, said time switch not shown in the drawings. The time switch is actuated in response to a signal from the microswitch 29 and operates the vacuum pump for a predetermined period as set by the time switch.

FIG. 3 is a sectional view taken along the line III—III of FIG. 2. As seen, the laminate 10 consisting of a plurality of printed circuit plates and an adhesive layer interposed between adjacent ones of said printed circuit plates, which is not shown in FIG. 2, is sandwiched between an upper jig 17 and a lower jig 31 and placed on the lower heating plate 22. These jigs are used for clamping the laminate 10 but are not essential.

The apparatus having a construction as described above operates in the following manner: Namely, the upper heating plate 21 and the lower heating plate 22 are previously heated at a temperature, for example, from 320° F. (160° C.) to 338° F. (170° C.). A semi-cured thermosetting adhesive 14, e.g. an adhesive obtained by impregnating a glass cloth with a semi-cured resin, is inserted between adjacent ones of a plurality of substrates 12 juxtaposed to form a laminate and each having circuits 13 formed on one or both surfaces thereof by etching. The laminate thus formed is placed centrally on the lower heating plate 22, after clamping it by means of the jigs 17 and 31 as required. Then, the ram 25 is slowly elevated to bring the lower heating plate 22 close to the upper heating plate 21. The upper jig 17 is brought into close contact with the upper heating plate 21, as shown in FIG. 4, at substantially the same time when the vacuum packing jig 24 contacts intimately with the lower heating plate 22 or a little while thereafter, and the laminate 10 is compressed therebetween. When the vacuum packing jig 24 is engaged by the lower heating plate 22, the strip 28 is brought into engagement with the microswitch 29 to actuate the same, whereby the vacuum pump 26 is set in motion, exhausting air from a sealed chamber 30 defined by the upper heating plate 21, the lower heating plate 22 and the vacuum packing jig holder 23 and the vacuum packing jig 24, and simultaneously the laminate 10 is compressed and heated.

Generally, air bubbles are formed in each adhesive layer in a period until the adhesive is molten and cured. For instance, when the laminate is heated to a temperature of about 320° F. (160° C.) to 338° F. (170° C.) and when the adhesive consists of an adhesive obtained by impregnating a glass cloth with a semi-cured resin, the adhesive is molten and cured in 3 to 5 minutes. Therefore, under such circumstances it is only necessary to operate the vacuum pump 26 so as to exhaust air from the sealed chamber for a period of 3 to 5 minutes after the commencement of compression. The operation of the vacuum pump may be controlled by the time switch.

Therefore, according to the present invention air present in each adhesive layer interposed between the adjacent substrates is removed therefrom and the individual printed circuit plates in the laminate can be bonded together by the adhesive layers, upon curing of said adhesive layer, without permitting air bubbles to be formed in said layers.

A "semi-cured thermosetting adhesive" is used in the present invention because it melts into a thickly molten state and thereby completely spreads over the entire surface of the substrate including the edges and corners of the circuit 13 whereby a high bonding strength is obtained. In contrast thereto, when an adhesive, which has been heated and hardened, is applied to the substrate and heated, such adhesive merely becomes soft and consequently gaps are formed between the surface of the substrate and the applied adhesive. Thus, high bonding strengths cannot be achieved.

The exhausting of air from the sealed chamber 30 must be commenced at a time immediately before or substantially the same as the commencement of compression of the laminate 10 and preferably at a time immediately before the commencement of compression to obtain a better result. This also means exhausting air from the sealed chamber 30 to some extent prior to commencing the compression.

As will be understood from the foregoing description it is possible according to the present invention to produce a multilayer printed circuit plate assembly with high accuracy, without permitting air bubbles to be formed in the respective adhesive layer.

What is claimed is:

1. An apparatus for producing a multilayer printed circuit plate assembly, comprising an upper heating plate, a lower heating plate, a vacuum packing jig means on one of said upper and lower heating plates, one of said upper and lower heating plates being movable upwardly and downwardly so as to form a sealed chamber with the other of said heating plates and said vacuum packing jig means when said two heating plates are juxtaposed, said sealed chamber being adapted to receive a laminate consisting of a plurality of printed circuit plates and at least one adhesive layer interposed between adjacent ones of said printed circuit plates, said upper and lower heating plates being adapted to compress and simultaneously heat the laminate received within said sealed chamber, a vacuum pump for exhausting air from said sealed chamber, means for communicating said sealed chamber with said vacuum pump, and means for actuating said vacuum pump so that the air may be exhausted from said sealed chamber continuously for a period from a time immediately before or substantially the same as the commencement of compression of said laminate at least to a time when said at least one adhesive layer is molten and cured.

References Cited

UNITED STATES PATENTS

| | | | |
|---|---|---|---|
| 2,351,058 | 6/1944 | Marks | 100—90 X |
| 3,305,416 | 2/1967 | Kahan et al. | 156—286 X |

CARL D. QUARFORTH, Primary Examiner

R. L. TATE, Assistant Examiner

U.S. Cl. X.R.

156—286